(12) United States Patent  
Chang et al.

(10) Patent No.: US 10,726,180 B1  
(45) Date of Patent: Jul. 28, 2020

(54) SYSTEMS AND METHODS FOR FIXING X-PESSIMISM FROM UNINITIALIZED LATCHES IN GATE-LEVEL SIMULATION

(71) Applicant: Avery Design Systems, Inc., Tewksbury, MA (US)

(72) Inventors: Kai-Hui Chang, North Andover, MA (US); Andrew Stein, Tewksbury, MA (US); Hong-zu Chou, Taipei (TW); Christopher S. Browy, Boston, MA (US); Chi-Lai Huang, Andover, MA (US)

(73) Assignee: Avery Design Systems, Inc., Tewksbury, MA (US)

( * ) Notice: Subject to any disclaimer, the term of this patent is extended or adjusted under 35 U.S.C. 154(b) by 0 days.

(21) Appl. No.: 16/280,163

(22) Filed: Feb. 20, 2019

Related U.S. Application Data

(62) Division of application No. 15/130,912, filed on Apr. 15, 2016, now abandoned.

(60) Provisional application No. 62/175,563, filed on Jun. 15, 2015, provisional application No. 62/159,670, filed on May 11, 2015.

(51) Int. Cl.
*G06F 30/30* (2020.01)
*G06F 30/331* (2020.01)
*G06F 30/398* (2020.01)

(52) U.S. Cl.
CPC ............ *G06F 30/331* (2020.01); *G06F 30/30* (2020.01); *G06F 30/398* (2020.01)

(58) Field of Classification Search
CPC ............... G06F 17/504; G06F 19/5009; G06F 17/50222; G06F 17/5027; G06F 30/20; G06F 30/30; G06F 30/33; G06F 30/331; G06F 30/398; G01R 31/318314; G01R 31/318342; G01R 31/318357; G01R 31/318364; G01R 31/318392
USPC .................................................. 716/102, 106
See application file for complete search history.

(56) References Cited

U.S. PATENT DOCUMENTS

| | | |
|---|---|---|
| 7,761,277 B2 | 7/2010 | Nicholas |
| 8,402,405 B1 | 3/2013 | Chang |
| 2010/0017187 A1 | 1/2010 | Hira |

(Continued)

OTHER PUBLICATIONS

Chang, et al., "Handling Nondeterminism in Logic Simulation So That Your Waveform Can Be Trusted Again", "D & T Early Access",, Publisher: IEEE, Published: Jan. 2011.

*Primary Examiner* — Paul Dinh
(74) *Attorney, Agent, or Firm* — Loginov & Associates, PLLC; William A. Loginov

(57) ABSTRACT

A computer executable processing component analyzes unknown (X) propagation from uninitialized latches in gate-level simulation and determines if the Xs cause false Xs to be generated due to X-pessimism. For Xs generated due to X-pessimism, simulation results are corrected and fixes are generated. Corrected simulation results match real hardware behavior and greatly reduces engineers' analysis effort on debugging X issues. A computer executable processing component analyzes unknown (X) propagation from sequential cells in gate-level logic simulation and determines if the Xs cause false Xs to be generated due to X-pessimism. For Xs generated due to X-pessimism, simulation results are corrected and fixes are generated. Corrected simulation results match real hardware behavior and greatly reduces engineers' analysis effort on debugging X issues.

15 Claims, 7 Drawing Sheets

(56) References Cited

U.S. PATENT DOCUMENTS

2010/0313175 A1   12/2010  Petlin
2012/0072876 A1*  3/2012  Salz .................... G06F 17/504
                                                                 716/102
2012/0239368 A1    9/2012  Agmon

* cited by examiner

SYSTEMS AND METHODS FOR FIXING X-PESSIMISM FROM UNINITIALIZED LATCHES IN GATE-LEVEL SIMULATION

RELATED APPLICATIONS

This application is a divisional of U.S. patent application Ser. No. 15/130,912, filed Apr. 15, 2016, entitled SYSTEMS AND METHODS FOR FIXING X-PESSIMISM FROM SEQUENTIAL CELLS IN GATE-LEVEL SIMULATION, the entire disclosure of which is herein incorporated by reference, which claims the benefit of U.S. Provisional Application Ser. No. 62/159,670, filed May 11, 2015, entitled SYSTEMS AND METHODS FOR FIXING X-PESSIMISM FROM UNINITIALIZED LATCHES IN GATE-LEVEL SIMULATION and U.S. Provisional Application Ser. No. 62/175,563, filed Jun. 15, 2015, entitled SYSTEMS AND METHODS FOR FIXING X-PESSIMISM FROM SEQUENTIAL CELLS IN GATE-LEVEL SIMULATION, the entire disclosures of each of which applications are herein incorporated by reference.

FIELD OF THE DISCLOSURE

The present disclosure relates generally to integrated circuit design and, most particularly, to (i) techniques for tracing unknowns (Xs) from uninitialized latches and generating fixes to eliminate false Xs generated due to X-pessimism in gate-level logic simulation; and (ii) techniques for analyzing unknowns (Xs) from sequential cells in gate-level simulation and generating fixes to eliminate false Xs produced due to X-pessimism.

BACKGROUND OF THE DISCLOSURE

Gate-level logic simulation is used extensively to verify the correctness of design netlists. Typically, input stimuli are applied to the netlist, and the simulation results are compared with a golden model or pre-defined checkers. When unknown values (Xs) exist, however, gate-level simulation can no longer produce correct results due to X-pessimism. FIG. 2 shows a classical example of a logical false X: the output of gate g4 should be 1 but logic simulation produces X instead. Such inaccuracy can produce numerous false Xs, rendering gate-level simulation useless. This problem is becoming severe due to physical optimizations and low-power requirements that allow Xs to exist in the design.

To eliminate logical false Xs, the SimXACT technique (U.S. Pat. No. 8,402,405) formally analyzes an input trace to find fixes that can eliminate all combinational false Xs encountered during the simulation of the trace. The inputs to SimXACT are a trace as input stimuli, a gate-level netlist, and a start time that the Xs should be checked for the first time to determine whether they are false or not. The output is auxiliary code that when the same X-pessimism conditions are encountered, those false Xs will be replaced with the correct values.

After the analysis of the trace is finished, the generated auxiliary code can be used with future simulation to eliminate the false Xs. This flow allows gate-level simulation to produce correct results.

SimXACT analysis is comprehensive and is guaranteed to produce correct simulation results that match real hardware. However, it only solves X-pessimism caused by logical false Xs. Another source of false Xs come from modeling of sequential elements for logic simulation. Take FIG. 3 for example, for a Flip-Flop (FF), if its clock is X and data input has changes, should the output be corrupted to X? In zero-delay simulation it is common that all clocks toggle at the same time and FF outputs changes accordingly. Given that the X at the clock of the FF may actually have an X→X change (in other words, it could be either 0→1 or 1→0 but no transition is detected by the FF because X→X does not create a transition in simulation), if the data input has changes the output may indeed need to be updated. Thus the modeling of FFs may conservatively corrupt the output of the FF to X when it sees changes at its data input and X at the clock pin. However, if the X is a stable 0 or 1 instead of an X→X transition, the output of the FF should not change, and the X corruption will create a false X that can corrupt more circuit elements in downstream logic, producing simulation results that are full of false Xs and difficult to analyze.

SUMMARY OF THE INVENTION

The present disclosure addresses the problems of the prior art by providing a computer executable processing component that eliminates false Xs coming from uninitialized latches and/or sequential cells, allowing logic simulation to produce correct results even if modeling issues exist.

It is an object of the present invention to provide a means of analyzing the fanout-cones of one or more uninitialized latches with X values and generating fixes to eliminate false Xs in downstream FFs when performing gate-level logic simulation. The fixes allow logic simulation to produce correct simulation values for the downstream FFs that originally have Xs, making it easy for designers to determine if the Xs are bugs or not.

It is another object of the present invention to provide a means of analyzing input, state and output value transitions of sequential cells and generating fixes to eliminate false Xs at outputs due to modeling inaccuracy. The fixes allow logic simulation to produce correct simulation values for the sequential cells that originally have Xs, making it easy for designers to determine if the Xs are bugs or not.

BRIEF DESCRIPTION OF THE DRAWINGS

The present disclosure below refers to the accompanying drawings, in which like reference numerals identify like elements in the figures, and in which.

DETAILED DESCRIPTION

Figure 1:
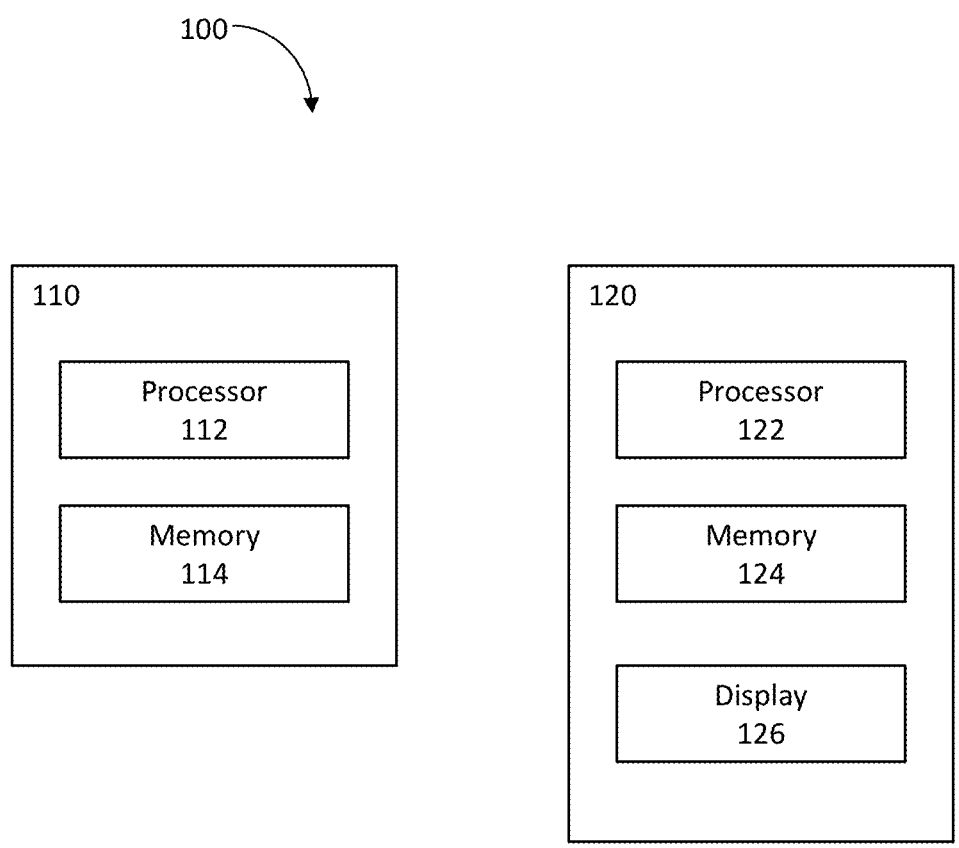
FIG. 1 is a block diagram of a system according to aspects of the disclosure.
Figure 2:
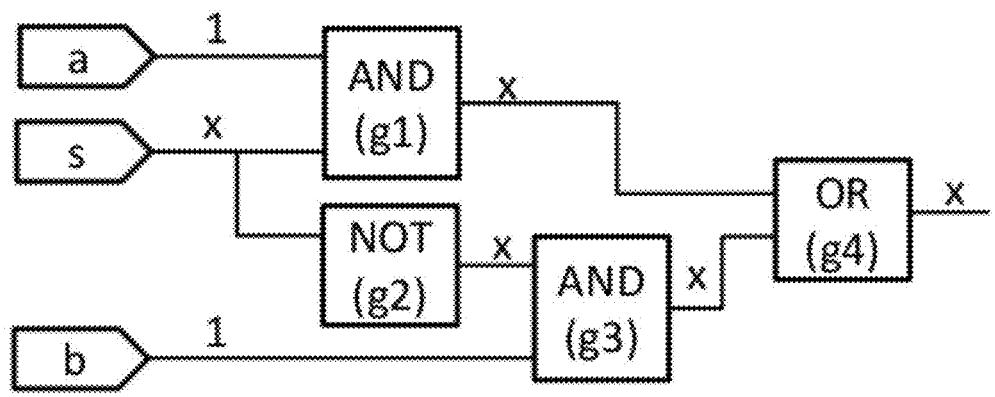
FIG. 2 illustrates an example of classical logical X-pessimism. The output of g4 should be 1 but logic simulation incorrectly produces X.
Figure 3:
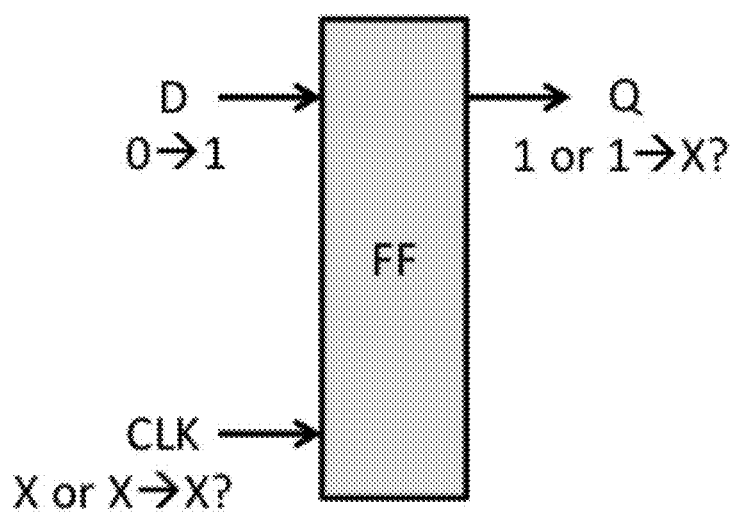
FIG. 3 illustrates an example FF and a modeling issue that may pessimistically corrupt output to X, thus creating a false X.

FIG. 1 is a block diagram of a system 100 according to aspects of the disclosure. As shown, the system 100 may include a computing device 110 and a client computing device 120.

The computing device 110 may include at least one processor 112, at least one memory 114, and any other components typically present in general purpose computers. The memory 114 may store information accessible by the processor 112, such as instructions that may be executed by the processor or data that may be retrieved, manipulated, or stored by the processor. The memory 114 and/or processor 112 can be programmed to carry out a set of logical or arithmetic operations. In one example, the logical or arithmetic operations may be stored on a non-transitory computer readable medium. The processor obtains information from memories, performs logical or arithmetic operations based on programmed instructions, and stores the results of the operations into memories. Although FIG. 1 illustrates processor 112 and memory 114 as being within the same block, it is understood that the processor 112 and memory 114 may respectively comprise one or more processors and/or memories that may or may not be stored in the same physical housing. In one example, computer 110 may be a server that communicates with one or more client devices 120, directly or indirectly, via a network (not shown). The computing device 110 can interact with users through input and output devices (not shown) such as keyboards, mouses, disks, networks, displays and printers.

The client computing device 120 may be configured similarly to the computer 110, such that it may include processor 122, a memory 124, and any other components typically present in a general purpose computer. The client device 120 may be any type of computing device, such as a personal computer, tablet, mobile phone, laptop, PDA, etc. In this example, the client device 120 may also include a display 126, such as an LCD, plasma, touch screen, or the like.

The computer executable processing component described in the present disclosure can be executed by the processor(s) of one or more computing devices, such as computing device 110 and/or client computing device 120, or any other computing device.

I. Techniques For Tracing Unknowns (Xs) From Uninitialized Latches And Generating Fixes To Eliminate False Xs Generated Due To X-Pessimism In Gate-Level Logic Simulation As mentioned above, one object of the present disclosure is to fix gate-level simulation when false Xs are generated due to uninitialized latches. The inputs to the tool are a gate-level netlist and stimuli to exercise the netlist. The output is auxiliary-code that when executed with the testbench, Xs in uninitialized latches whose downstream FFs are generating false Xs will be replaced with non-X values so that those false Xs can be eliminated. The fixes allow logic simulation to produce correct simulation values for the downstream FFs. The systems and methods described in the present disclosure can be used with our SimXACT analysis (U.S. Pat. No. 8,402,405) to eliminate all false Xs in the design that include both logical false Xs and Xs due to modeling issues.

A. Brief Description of Clock Gaters

Clock gaters can turn off clocks to downstream FFs in order to reduce power consumption. When a clock gater enables a clock, the output of the clock gater toggles with the input clock. When the clock gater disables a clock, the output of the clock gater remains constant and does not toggle. Clock gaters are typically implemented with a latch in order to solve meta-stability issues so that clean output clocks can be generated. Two types of clock gaters are commonly used: AND and OR types.

Figure 4:
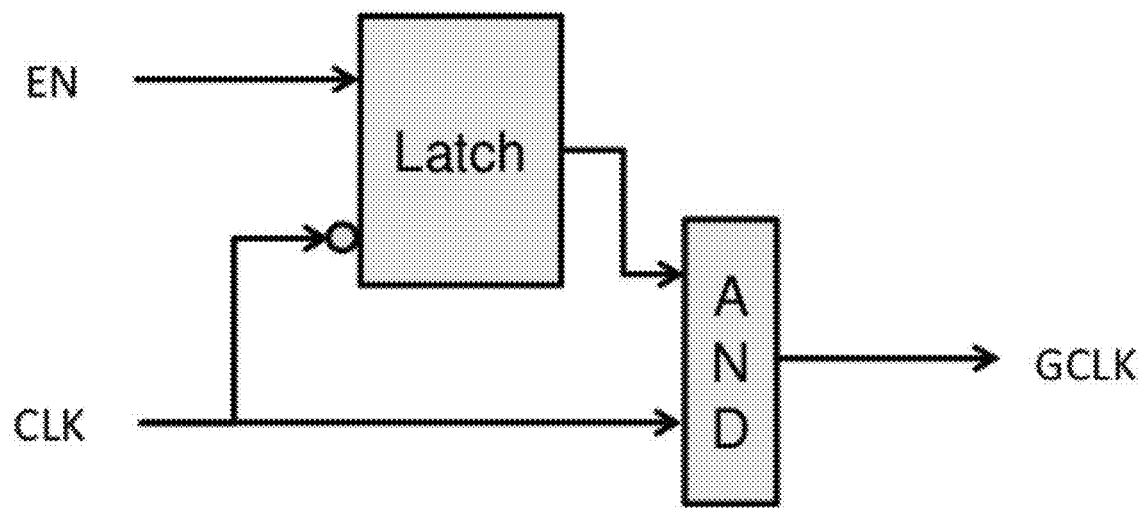
FIG. 4 illustrates an AND-type clock gater, wherein the latch should hold value when CLK is 1 and should be transparent to EN when CLK is 0.

FIG. 4 shows an AND-type clock gater. Assume clock enable (EN) is not X when the first clock toggles, if all downstream FFs are positive-edge triggered, then the initial X value in the uninitialized latch can be replaced with any non-X value without masking any bug, (e.g., where a "bug" can mean in real hardware the X can be either 0 or 1 depending on how the system is powered up and producing a non-deterministic system state). The reason is that if clock (CLK) starts at 0, the first output clock (GCLK) will be 0→1 when EN is 1 and stays at 0 when EN is 0, so no Xs will be produced at all. If CLK starts at 1, since latch output is X initially, the first GCLK transition will be X→0. However, since all downstream FFs are positive-edge triggered, no matter the X is 0 or 1, none of the FFs will latch any value. Therefore, it is safe to replace the X in the latch with any value without masking any bug.

Figure 5:
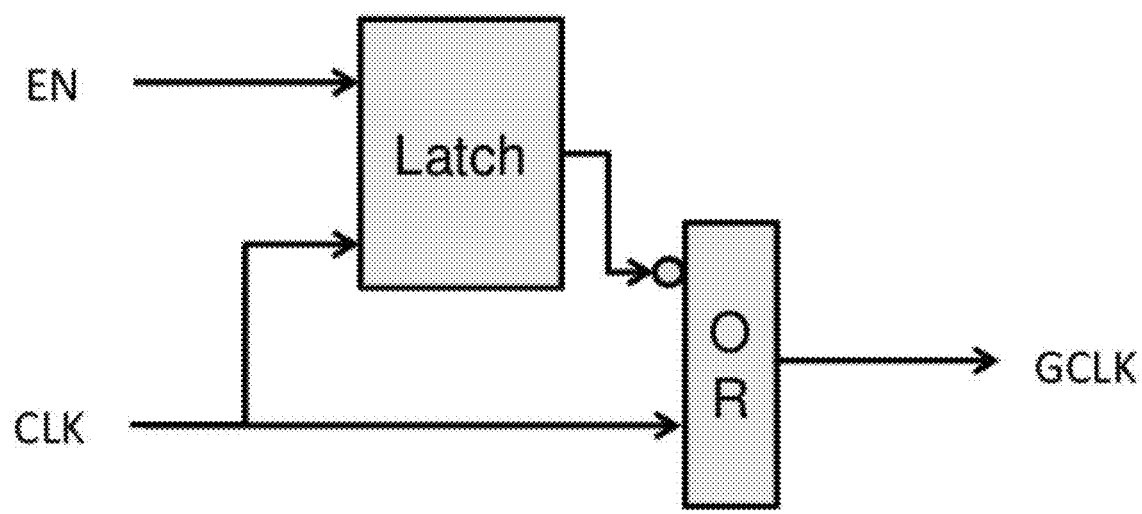
FIG. 5 illustrates an OR-type clock gater, wherein the latch should hold value when CLK is 1 and should be transparent to EN when CLK is 0.

FIG. 5 shows an OR-type clock gater. Its behavior is the same as AND-type except the first edge is 1→0, stays at 1, or X→1. Downstream FFs should be negative-edge triggered.

B. Recognize Latches that Can be Deposited

In one example, an initial step can be to recognize latches that can be safely deposited with non-X values at time 0 without affecting simulation correctness. In other words, only false Xs will be eliminated and real Xs will remain untouched. As explained earlier, latches in clock gaters are most likely safe to deposit if the type of clock gater matches the active edges of downstream FFs. For AND-type clock gaters, all downstream FFs must be positive-edge triggered. For OR-type clock gaters, all downstream FFs must be negative-edge triggered. This step is optional if the user already has this information from synthesis tools. But if not or if the user is uncertain about the correctness from synthesis tools, the following step can be used to recognize latches used in clock gaters that are safe to deposit.

The procedure to recognize latches used in clock gaters works as follows. Given a latch, trace its fanout cone until another sequential element (a latch or a FF) or output of the design is reached. Then the following rules are used to determine whether the latch can be safely deposited:

(1) If a latch or primary output is reached, the latch cannot be safely deposited.

(2) If logic other than AND, OR, INVERTER and BUFFER is encountered when tracing the fanout cone, the latch most likely is not used in a clock gater and cannot be safely deposited.

(3) If AND/OR is encountered for every path to each downstream FF and the polarity (with BUFFERS and INVERTERs along the path considered) matches all FFs' active edges, the latch can be safely deposited.

(4) If a latch does not match type (1)-(3), it cannot be safely deposited.

The generated deposit list is a list of latches that can be deposited. The list should be converted to commands in Verilog, VHDL, TCL or any other format that controls simulation behavior to perform the deposit. The deposit value can be 0, 1 or any non-X value.

The above procedure can be applied to all latches in the design to identify all latches that can be safely deposited at time 0. However, the number of such latches can be large, and most likely only a small number of latches will create false Xs in downstream FFs. Therefore, we propose the following steps to reduce the number of latches that need to be deposited.

To reduce the number of latches to deposit, we monitor simulation values in latches and downstream FFs starting from a time when simulation values represent the initial circuit state, usually at time 0.

Figure 6:
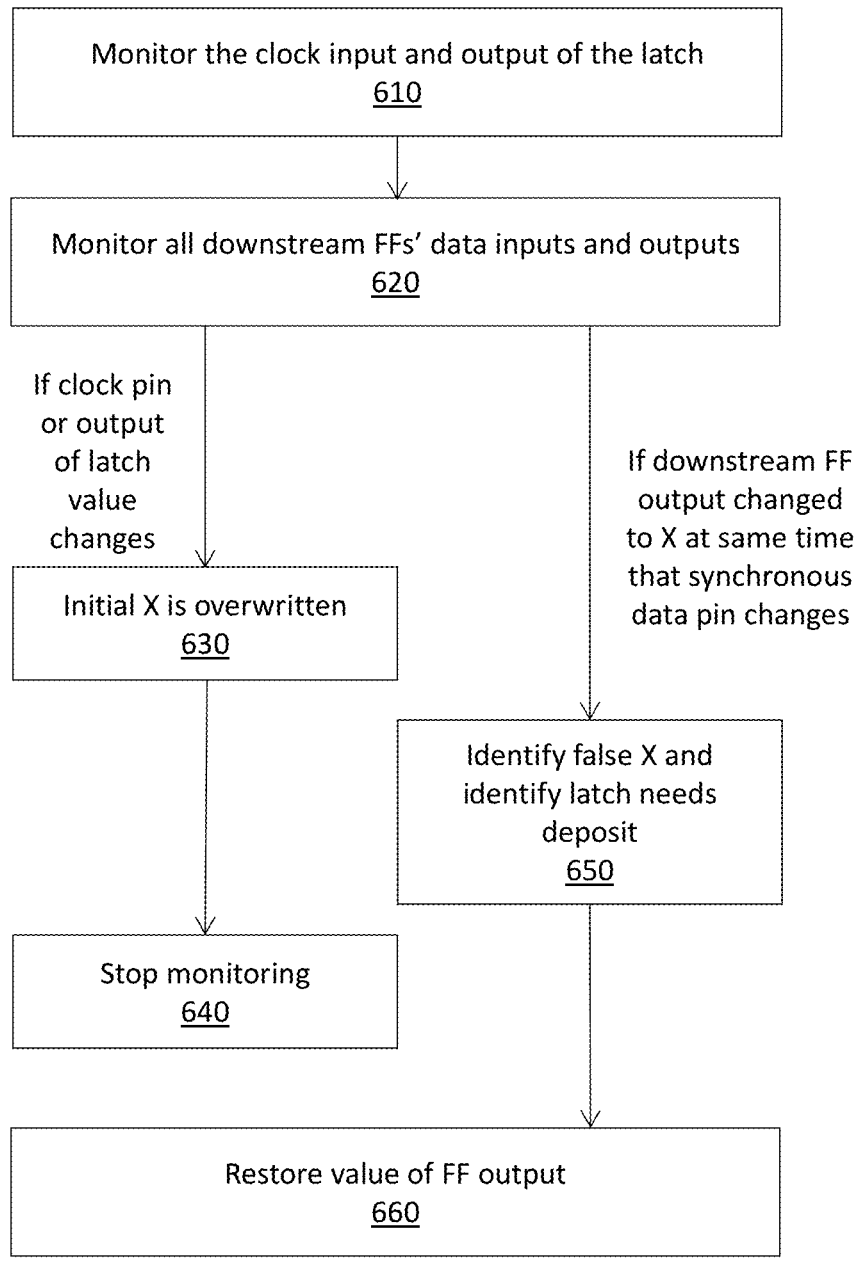
FIG. 6 depicts a method to determine if a latch needs to be deposited so that its downstream FFs will not generate false Xs.

FIG. 6 depicts a method to determine if a latch needs to be deposited so that its downstream FFs will not generate false Xs.

At block 610, monitor the clock input and the output of the latch if the output of the latch is X at initial circuit state time.

At block 620, monitor all downstream FFs' data inputs and outputs.

At block 630, if the clock pin or output of the latch has value changes, the initial X is over-written and the monitor for the latch and its downstream FFs is stopped at block 640.

At block 650, prior to the monitor on a latch stops at block 640, if its downstream FF's output changed to X at the same time that its synchronous data pin changes, the X is false and the latch needs deposit. The latch is added to the deposit list.

At block 660, the value at the FF's output should also be restored to the original value for simulation to proceed correctly.

The deposit list eliminates Xs in latches that create false Xs in downstream FFs observed when simulating the given stimuli. They are always correct because only latches that are structurally proven to be used in clock gaters and match downstream FFs' polarity are monitored. Therefore, the deposits can be applied to other tests as well. If any test fails due to Xs, the same analysis procedures can be applied to the test to generate a new list. The new list and the original list can then be combined to produce another list that will resolve X issues for all analyzed tests.

II. Techniques For Analyzing Unknowns (Xs) From Sequential Cells In Gate-Level Simulation And Generating Fixes To Eliminate False Xs Produced Due To X-Pessimism Another object of the present disclosure is to fix gate-level simulation when false Xs are generated due to sequential cell modeling inaccuracy. The inputs to the tool are a gate-level netlist and stimuli to exercise the netlist. The output is auxiliary-code that when executed with the testbench, false Xs from inaccurately modeled sequential cells will be replaced with correct non-X values so that those false Xs can be eliminated. The fixes allow logic simulation to produce correct simulation values that match real hardware. The systems and methods described in this invention can be used with our SimXACT analysis (U.S. Pat. No. 8,402,405) to eliminate all false Xs in the design that include both logical false Xs and Xs due to modeling issues.

A. Brief Description of Sequential Cell Modeling in Logic Simulation

A sequential cell contains one or more storage elements that keep track of the state of the cell. For example, a Flip-Flop (FF) is a sequential cell commonly used in hardware that can store and preserve information. The simplest FF contains a clock pin, a data pin and an output pin. Take a positive-edge triggered FF as an example, when the clock goes from 0 to 1, the value at the data input is propagated to the output and stored in the FF. The output does not change again unless another 0 to 1 transition at the clock is observed even if there are value changes in the data input.

Hardware Description Languages (HDLs) such as Verilog or VHDL provide several different means to describe how sequential cells behave so that logic simulators can mimic their behavior and produce simulation results that are as close to real hardware as possible. In gate-level simulation, the behavior of sequential elements is often modeled using primitives and Sequential User Defined Primitives (SUDPs). A primitive performs basic Boolean operations such as AND, OR, XOR, etc. An SUDP is similar to a truth table and defines how the state of the element should change based on input changes.

A simple SUDP description of a positive-edge triggered FF using the Verilog hardware description language is shown below. In SUDP definitions, "?" means any value, and "x" means the value is X. "Data" is the data pin, "Clock" is the clock pin, "Qt" is the state at the current time, and "Qt+1" is state after any input transition. If nothing is matched then the "Qt+1" is assumed to be X.

| Data | Clock | Qt | Qt + 1 |
|------|-------|----|--------|
| 1    | (01)  | ?  | 1      |
| 0    | (01)  | ?  | 0      |
| ?    | ?     | ?  | x      |

The SUDP above can accurately model the behavior of a simple FF when all inputs have known non-X values. When Xs are involved, however, inaccuracy arises. For example, if "Clock" is X, "Qt" is 1, and "Data" goes from 0 to 1, should the next state "Qt+1" stay at 1, be updated to 0, or be updated to X? It depends on whether there is an active transition at "Clock" at the same time that "Data" changes. In four-value (01XZ) logic simulation, because X to X transition is not observable, whether a transition exits at "Clock" cannot be reliably determined.

Figure 7:
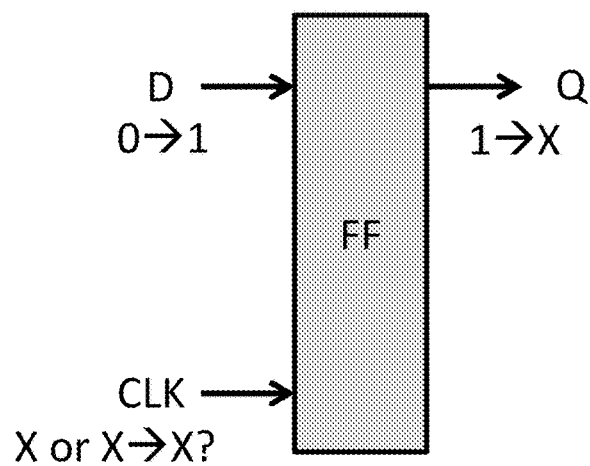
FIG. 7 presents an example FF and modeling issues that may pessimistically corrupt its output to X, thus creating a false X.

In this case, the safest way is to assume there is a transition at the clock and corrupt the next state "Qt+1" to X, as the SUDP models. FIG. 7 illustrates this situation.

Figure 8:
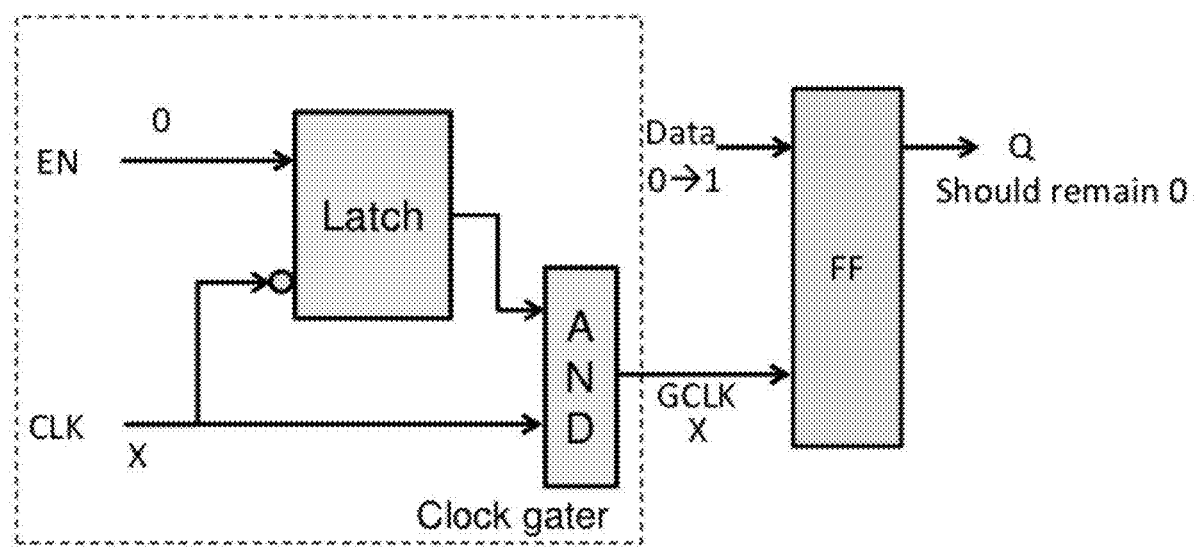
FIG. 8 presents an example FF whose clock is gated and will not toggle. Corrupting the FF output to X when "Data" input has a transition will create a false X because the output should remain 0.

However, such an assumption can be overly pessimistic. For example, as FIG. 8 shows, if "Clock" comes from a clock gater that is disabled and the clock of the clock gater is X, then the clock gater output that drives the "Clock" pin of the FF is X but will never change. In this case, corrupting "Qt+1" to X is pessimistic and a false X is produced. As another example, assume that there is a delay between the time "Clock" changes and the time the FF output changes for every FF in the design, then "Clock" and "Data" will never change at the same time, and corrupting "Qt+1" will also create a false X. To address this problem, the following line can be added to the SUDP that models the FF ("-" means the state should not change):

| Data | Clock | Qt | Qt + 1 |
|------|-------|-----|--------|
| 1    | (01)  | ?   | 1      |
| 0    | (01)  | ?   | 0      |
| (01) | x     | ?   | —      |
| ?    | ?     | ?   | x      |

After this line is added, "01" transition at "Data" input is ignored if "Clock" is X, thus eliminating the false X shown in FIG. 8. To ignore "10" transition at "Data" input when "Clock" is X, another row with (10) at "Data" can be added.

Another commonly used sequential element is clock gater. Clock gaters can turn off clocks to downstream FFs in order to reduce power consumption. When a clock gater enables a clock, the output of the clock gater toggles with the input clock. When the clock gater disables a clock, the output of the clock gater remains constant and does not toggle. Clock gaters are typically implemented with a latch in order to solve meta-stability issues so that clean output clocks can be generated.

Figure 9:
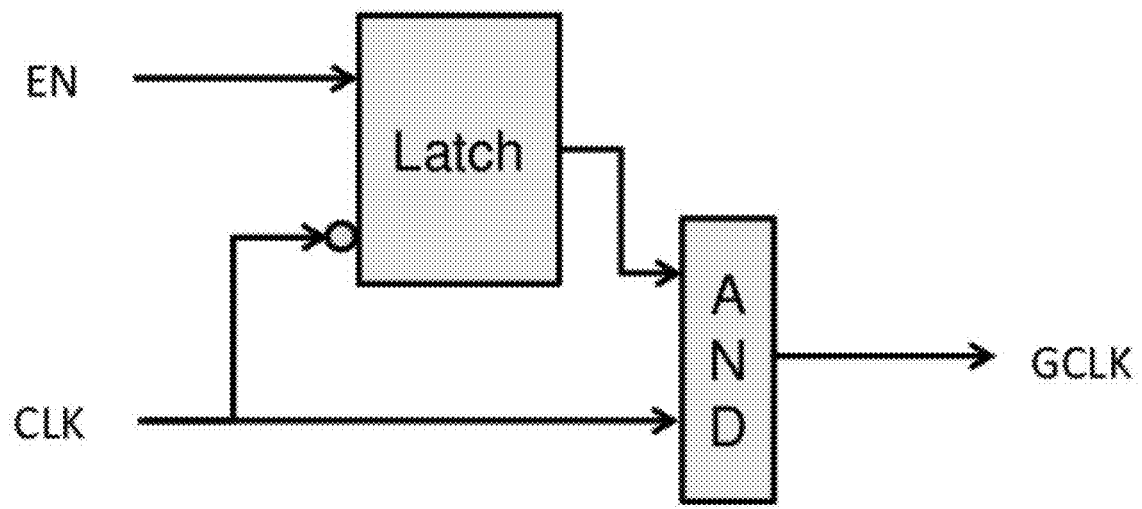
FIG. 9 illustrates an AND-type clock gater. The latch should hold value when "CLK" is 1 and should be transparent to "CLK" when "CLK" is 0.

FIG. 9 shows an AND-type clock gater. When CLK is 1, the latch acts transparent and the value of EN (clock gater enable) passes to the output of the latch directly. When CLK goes from 1 to 0, the latch stores the value of EN when the transition occurs. When CLK is 0, the latch preserves the value of EN when it is stored and does not change its output even if there are additional changes in EN.

Figure 10:
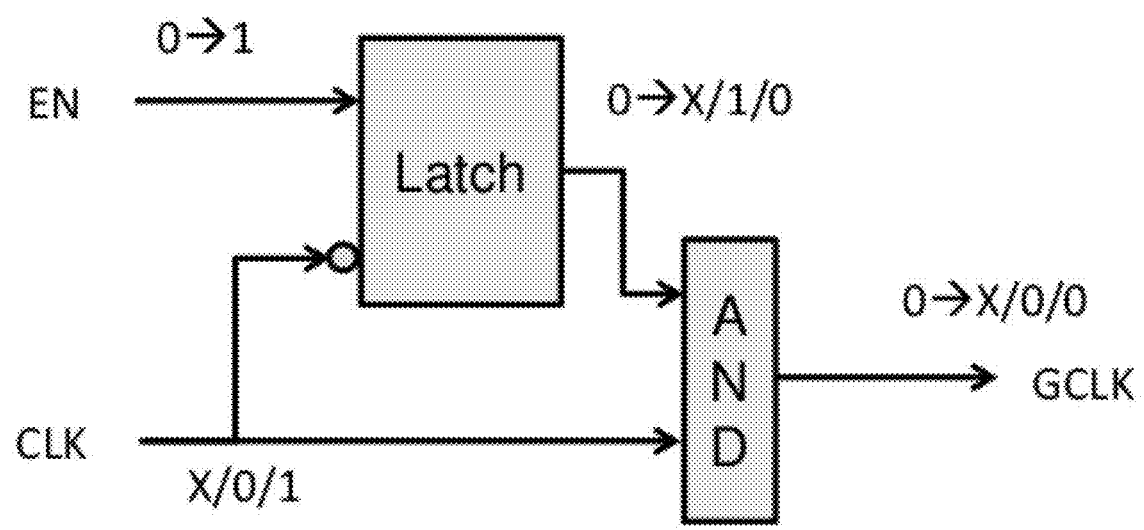
FIG. 10 illustrates an example of a false X generated at the clock gater output. In the example, "EN" has a transition from 0 to 1. "CLK" is X; wherein "X/0/1" is used to split the case of X when it is 0 and 1, and at "Latch", originally its value is 0. Due to the transition at "EN", logic simulation produces X, and real hardware value is I/O when "CLK" is 0/1, and wherein, logic simulation produces X at GCLK, but the real hardware value is always 0 irrespective of whther "CLK" is set to 0 or 1.

False Xs can be generated from the clock gater even if the latch and the AND gate are modeled correctly without X pessimism. For example as shown in FIG. 10, assume the latch has value 0, CLK is X and EN goes from 0 to 1. Because the value of CLK is unknown, it is assumed that the transition may propagate to the output of the latch. At the AND gate, 1 AND X produces X, and the clock gater produces a 0 to X transition at output GCLK. However, further analysis shows that GCLK should stay 0 instead of changing to X. The reason is that if the X at CLK is 0, then even though the latch can propagate the 0 to 1 transition to its output, 1 AND 0 is still 0. Therefore, GCLK remains 0. If CLK is 1, then the latch keeps its value and its output remains 0. Since 0 AND 1 is still 0, the output GCLK should remain 0. Therefore, no matter the X at CLK is 0 or 1, GCLK should always remain 0. Note that this problem cannot be fixed by changing the modeling of the latch because when CLK is 0, its internal state should be updated to 1. But when CLK is 1, its internal state should remain 0. Therefore, corrupting the output of the latch to X is correct.

2. Identify False Xs due to Sequential Cell Modeling Inaccuracy

Figure 11:
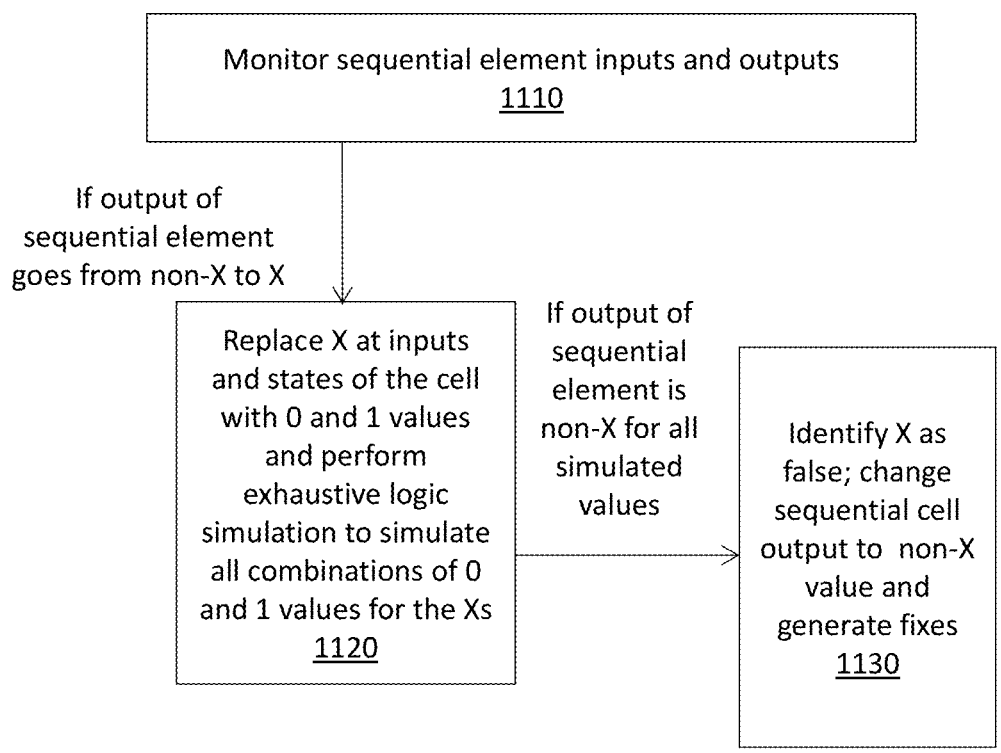
FIG. 11 is a flow chart depicting a method of identifying false Xs due to sequential cell modeling inaccuracy.

FIG. 11 depicts a method to identify false Xs due to sequential cell modeling inaccuracy according to one or more aspects of the disclosure.

At block 1110, monitor sequential element (FFs, clock gaters, etc.) inputs and outputs. If an output of a sequential element goes from non-X to X, there must be a transition at its inputs and at least one input or current state is X.

When this is observed, at block 1120, replace the Xs at inputs and states of the cell with 0 and 1 values and perform exhaustive logic simulation to simulate all combinations of 0 and 1 values for the Xs. In one example, replace each X with 0 and 1 values and repetitively perform simulations until all values for all Xs have been simulated. If there are n Xs, up to $2^n$ simulations will need to be performed.

At block 1130, if all the simulations produce the same non-X value at the output, then the X is false, and the correct value is the produced non-X value.

Note that while determining whether to check for false Xs for sequential element, one can also check all cycles where an output is X no matter its value at the previous cycle is X or not. This will ensure no false Xs will be missed. However, doing so can create considerable overhead during logic simulation and may not be practical. In addition, we observe that most false Xs occurs when the output goes from non-X to X. Therefore, in one example one may only check when an output goes from non-X to X. However, the user can still opt to check all cycles that the output is X.

To improve the efficiency of the process, data structures such as hash tables can be used to keep track of transitions that have been checked. If a transition has been checked, its result can be directly used and no logic simulation in blocks 1120 and/or 1230 needs to be performed.

In block 1120, logic simulation can be aborted early if simulating one of the patterns already produced a different value or an X at the output.

3. Fixes for Identified False Xs

The previous section describes how false Xs can be identified. In this section we describe how fixes can be generated to identify the false Xs. When a false X is found during simulation, the X should be replaced with the non-X value instantly, and simulation can proceed with the correct value. This can typically be done using programming interfaces provided by logic simulators that can control simulator behavior. The following fix can then be generated and included for future simulation to fix the same problem:

whenever output changes from non-X to X
 if (element input transitions, current states and output value match the false X condition)
  replace output X with correct non-X value until the next input value change;

The fix can be implemented in several different ways such as using the HDL itself or through programming interfaces that can change simulator behaviors. The correct value that eliminates the false X should be forced into the sequential cell output and be released when there is a new input change.

The foregoing has been a detailed description of illustrative embodiments of the invention. Various modifications and additions can be made without departing from the spirit and scope of this invention. Features of each of the various embodiments described above can be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while one X-pessimism example is shown for illustrative purpose, any design netlist can be employed in accordance with the teachings herein. Also, where a "mean" is referenced it should be taken to include a particular functional component/process/processor described herein, or various combinations of (all or part of) a plurality of components/processes/processors described herein. Accordingly, this description is meant to be taken only by way of example, and not to otherwise limit the scope of this invention.

What is claimed is:

1. A method of identifying false Xs due to sequential cell modeling inaccuracy, comprising:
 monitoring at least one input and at least one output of a sequential element;
 if the at least one output changes from non-X to X, then:
  replacing the Xs at the at least one input with 0 and 1 values;

replacing the Xs in states of the sequential element with 0 and 1 values; and performing exhaustive logic combinations to simulate all combinations of 0 and 1 values for the Xs; and if the exhaustive logic simulations produce a consistent value of non-X, then identifying the X as false and restore the output to the non-X value.

2. The method of claim 1, wherein the monitoring of the at least one input comprises monitoring a clock input.

3. The method of claim 1, further comprising:
monitoring all downstream flip-flop inputs and outputs.

4. The method of claim 1, wherein monitoring at least one output of the sequential element comprises monitoring the output of a latch if the output of the latch is X at an initial circuit state time.

5. The method of claim 1, wherein the sequential element comprises at least one of a flip-flop (FF) or a clock gater.

6. The method of claim 1, wherein the exhaustive logic simulation is aborted early.

7. The method of claim 1, wherein monitoring is performed during simulation.

8. A method of identifying false Xs due to sequential cell modeling inaccuracy, comprising:

monitoring at least one output of a sequential element;
if the at least one output changes from non-X to X, then:
replacing the Xs at the at least one input with 0 and 1 values;
replacing the Xs in states of the sequential element with 0 and 1 values; and
performing exhaustive logic combinations to simulate all combinations of 0 and 1 values for the Xs; and
if the exhaustive logic simulations produce a consistent value of non-X, then identifying the X as false and restore the output to the non-X value.

9. A system for identifying false Xs due to sequential cell modeling inaccuracy comprising:

a processor; and a memory having executable instructions stored there on such that, when executed by the processor, result in the processor being configured to:

monitor at least one input and at least one output of a sequential element;

if the at least one output changes from non-X to X, then:
replace the Xs at the at least one input with 0 and 1 values;
replace the Xs in states of the sequential element with 0 and 1 values; and
perform exhaustive logic combinations to simulate all combinations of 0 and 1 values for the Xs; and
if the exhaustive logic simulations produce a consistent value of non-X, then identify the X as false and restore the output to the non-X value.

10. The system of claim 9, wherein the processor being configured to monitor the at least one input comprises being configured to monitor a clock input.

11. The system of claim 9, the processor being further configured to:
monitor all downstream flip-flop inputs and outputs.

12. The system of claim 9, wherein the processor being configured to monitor at least one output of the sequential element comprises being configured to monitor the output of a latch if the output of the latch is X at an initial circuit state time.

13. The system of claim 9, wherein the sequential element comprises at least one of a flip-flop (FF) or a clock gater.

14. The system of claim 9, wherein the exhaustive logic simulation is aborted early.

15. The system of claim 9, wherein the monitor the at least one input and the at least one output of the sequential element is configured to be performed during simulation.

\* \* \* \* \*